(12) United States Patent
Kim et al.

(10) Patent No.: US 9,007,755 B2
(45) Date of Patent: Apr. 14, 2015

(54) FLAT PANEL TYPE IMAGE DISPLAY DEVICE AND METHOD FOR MANUFACTURING THE SAME

(75) Inventors: Chang-Il Kim, Paju-si (KR); Byung In Park, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 178 days.

(21) Appl. No.: 13/542,457

(22) Filed: Jul. 5, 2012

(65) Prior Publication Data

US 2013/0010413 A1    Jan. 10, 2013

(30) Foreign Application Priority Data

Jul. 5, 2011   (KR) .................. 10-2011-0066634
May 29, 2012   (KR) .................. 10-2012-0056841

(51) Int. Cl.
   *G02F 1/1333*   (2006.01)
   *G09F 9/33*     (2006.01)
   *H05K 5/00*     (2006.01)

(52) U.S. Cl.
   CPC .............. *G09F 9/33* (2013.01); *H05K 5/0013* (2013.01)

(58) Field of Classification Search
   CPC .................................................. G02F 1/1333
   USPC .................. 349/58, 61, 62; 361/679.21, 361/679.22–679.25, 679.26–679.3, 679.55, 361/679.56; 445/24; 346/905
   See application file for complete search history.

(56) References Cited

U.S. PATENT DOCUMENTS

| | | | |
|---|---|---|---|
| 7,742,121 B2 * | 6/2010 | Mori et al. | 349/58 |
| 2002/0186333 A1 * | 12/2002 | Ha et al. | 349/58 |
| 2003/0043310 A1 * | 3/2003 | Cho | 349/58 |
| 2006/0178267 A1 * | 8/2006 | Kim et al. | 503/227 |
| 2007/0273806 A1 | 11/2007 | Lin et al. | |
| 2008/0158473 A1 | 7/2008 | Liang | |
| 2011/0128465 A1 * | 6/2011 | Park | 349/61 |
| 2011/0187634 A1 * | 8/2011 | Kim et al. | 345/102 |

FOREIGN PATENT DOCUMENTS

| | | |
|---|---|---|
| CN | 101329461 | 12/2008 |
| CN | 201402358 Y | 2/2010 |
| WO | WO 2010084653 A1 | 7/2010 |

OTHER PUBLICATIONS

Office Action issued in corresponding Chinese Patent Application No. 201210232379.X, mailed Feb. 24, 2014, 14 pages.

* cited by examiner

*Primary Examiner* — Jayprakash N Gandhi
*Assistant Examiner* — Mandeep Buttar
(74) *Attorney, Agent, or Firm* — Brinks Gilson & Lione (57) ABSTRACT

Disclosed are a flat panel type image display device of a clear borderless design without a case defining an external appearance of an image display device, and a method for manufacturing the same. The flat panel type image display device includes an image display panel to display an image, a panel guide including a panel fixing portion, to which the image display panel is attached, and a guide frame formed in a dual coupling structure, the panel fixing portion being configured to move together with the guide frame in at least one direction of x, y, and z-axis directions, and a bottom case formed to cover an opened back surface of the panel guide comprising a back surface of the image display panel, the bottom case being fixed to an inner side surface of the panel guide.

10 Claims, 11 Drawing Sheets

FLAT PANEL TYPE IMAGE DISPLAY DEVICE AND METHOD FOR MANUFACTURING THE SAME

This application claims the benefit of Korean Patent Application No. 10-2011-0066634, filed on Jul. 5, 2011, and Application No. 10-2012-0056841, filed May 29, 2012, which is hereby incorporated by reference as if fully set forth herein.

BACKGROUND

1. Field of the Invention

The present disclosure relates to a flat panel type image display device of a clear borderless design without a case defining an external appearance of an image display device, and more particularly, to a flat panel type image display device and a method for manufacturing the same capable of allowing an image display panel to be fixed to a dual coupling structure, thereby preventing faults caused by the fixed structure of the image display panel.

2. Discussion of the Related Art

Recently, Liquid Crystal Display (LCD) devices, Plasma Display Panel (PDP) devices, Field Emission Display (FED) devices, and Light Emitting Display (LED) devices are being utilized as Flat Panel Display (FPD) devices used in personal computers, portable terminals, and a variety of monitors of information equipment.

In such an FPD device, a display panel to display an image is seated at a separate guide bracket or a panel guide, to be assembled within a front cover or a back cover defining an external appearance of the FPD device. Particularly, in the case of the LCD device including a liquid crystal panel, the liquid crystal panel is further provided, at a back surface thereof, a backlight unit due to absence of self light emitting elements, and is assembled together with the panel guide, the back cover, etc.

In order to meet various demands of consumers recently taking into consideration a design aspect and pursuing a lightweight and thin product, there is a need for development of a flat panel type image display device, namely, a flat panel type image display device of a clear borderless design without the front cover, the top case or the like defining the external appearance of the FPD device.

The conventional flat panel type image display device of the clear form is assembled in such a manner that the image display panel, the guide bracket, the backlight unit, etc., except for the front cover or the top case, are fixed by a separate adhesive means or fixing means. However, since the image display panel is directly fixed to assembly structure such as the guide bracket or the like in the conventional structure, the image display panel and the assembly structure is deformed during generation of external pressure or impact, thereby causing various faults such as leakage of light. Also, since assembly and disassembly processes of the flat panel type image display device are complicated, there is a problem in that process yield is deteriorated.

BRIEF SUMMARY

A flat panel type image display device includes an image display panel for displaying an image, a panel guide including a panel fixing portion, to which the image display panel is attached, and a guide frame formed in a dual coupling structure, the panel fixing portion, to which the image display panel is attached, being configured to move together with the guide frame in at least one direction of x, y, and z axis directions, and a bottom case formed to cover an opened back surface of the panel guide comprising a back surface of the image display panel, the bottom case being fixed to an inner side surface of the panel guide.

In another aspect of the present invention, a method for manufacturing a flat panel type image display device includes assembling a panel guide in a dual coupling structure in which a panel fixing portion and a guide frame is coupled so that the panel fixing portion and the guide frame are movable in at least one axis direction of x, y, and z axis directions, assembling a bottom case formed to cover an opened back surface of the panel guide to the panel guide, and attaching an image display panel to display an image to a front surface of the panel guide.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Hereinafter, a flat panel type image display device and a method for manufacturing the same according to the present invention will be described in detail with reference to exemplary embodiments, taken in conjunction with the accompanying drawings. Wherever possible, the same reference numbers will be used throughout the drawings to refer to the same or like parts.

As the flat panel type image display device of the present invention, a Plasma Display Panel (PDP) device, an Organic Light Emitting Display (OLED) device, etc. may be applied, in addition to a Liquid Crystal Display (LCD) device and a Field Emission Display (FED) device. Although all technical features of the present invention may be applied to the flat panel type image display devices, an example applied to the LCD device will be described below for convenience of description.

Figure 1:
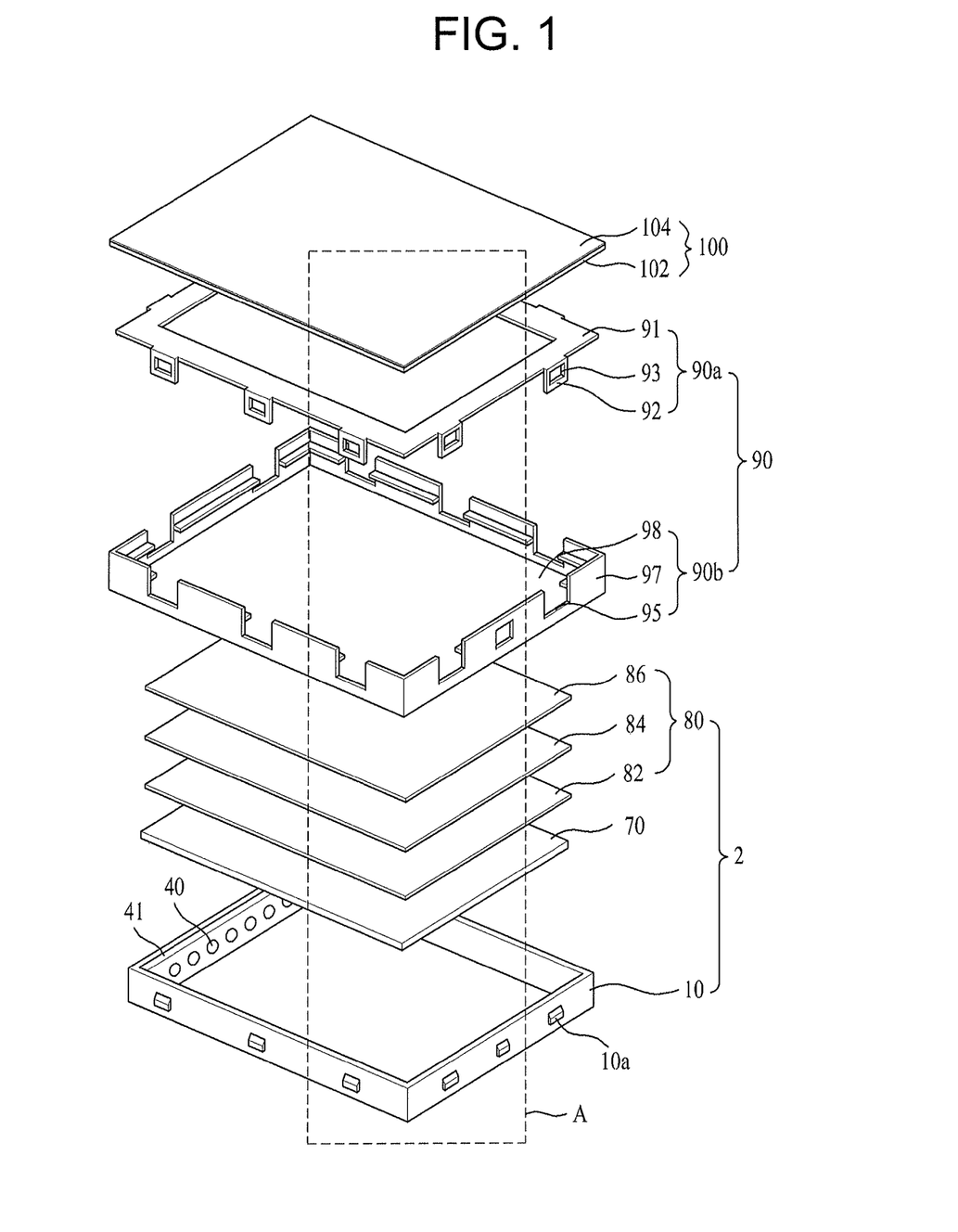
FIG. 1 is an exploded perspective view schematically illustrating a flat panel type image display device according to an embodiment of the present invention.

FIG. 1 is an exploded perspective view schematically illustrating a flat panel type image display device according to an embodiment of the present invention.

The flat panel type image display device shown in FIG. 1, for example, the LCD device includes a liquid crystal panel 100 to display an image, a panel guide 90 including a panel fixing portion 90a, to which the liquid crystal panel 100 is attached, and a guide frame 90b formed in a dual coupling structure, the panel fixing portion 90a, to which the liquid crystal panel 100 is attached, being configured to move together with the guide frame 90b in at least one direction of x, y, and z axis directions, a bottom case 10 formed to cover an opened back surface of the panel guide 90 including the back surface of the liquid crystal panel 100 and fixed to an inner side surface of the panel guide 90, and a backlight unit 2 to irradiate light to the back surface of the liquid crystal panel 100 while being constituted in a form of being accommodated at the bottom case 10.

The liquid crystal panel 100 is attached, at the outer edge portion of the back surface thereof, to the panel guide 90, and displays an image by using light emitted from the backlight unit 2. To this end, the liquid crystal panel 100 includes a lower substrate 102, an upper substrate 104, a liquid crystal (not shown) disposed between the lower and upper substrates 102 and 104, and a spacer (not shown) for uniformly maintaining a distance between the lower and upper substrates 102 and 104.

The upper substrate 104 includes a color filter, a black matrix, a common electrode, etc.

The lower substrate 102 includes Thin Film Transistors (TFTs) formed at respective cell regions defined by data lines and gate lines, and pixel electrodes connected to the TFTs. The TFTs respond to gate-on voltage supplied from the gate lines so as to transfer image signals supplied from the data lines to the pixel electrodes. Here, the common electrode formed at the upper substrate 104 may be formed at the lower substrate 102 according to a liquid crystal mode.

Although not shown in the drawings, the lower substrate 102 is provided, at a non-display portion thereof, with data pad regions and gate pad regions, which are connected to the data lines and the gate lines, respectively.

A plurality of data circuit films are attached to the data pad regions, and data integrated circuits are mounted on the plural data circuit films so as to supply image signals to the data lines. The data integrated circuits may also be mounted on the lower substrate 102 by a Chip On Glass (COG) manner. In this case, the data integrated circuits mounted on the lower substrate 102 are supplied with data signals from a data printed circuit board (PCB) through the data circuit films.

A plurality of gate circuit films are attached to the gate pad regions, and gate integrated circuits are mounted on the plural gate circuit films so as to supply gate-on voltage to the gate lines. The gate integrated circuits may be mounted on the lower substrate 102 by a COG manner, or be formed on the lower substrate 102 during manufacturing process of the TFTS.

The panel guide 90 is mounted at front and side surfaces of the bottom case 10 so as to enclose the backlight unit 2, in other words, front and side surfaces of an outer wall of the bottom case 10. The panel guide 90 includes a panel fixing portion 90a, to which the outer edge portion of the back surface of the liquid crystal panel 100 is fixed, and a guide frame 90b, to which the panel fixing portion 90a is assembled. The panel fixing portion 90a and the guide frame 90b are coupled in a dual structure. The panel fixing portion 90a and the guide frame 90b are coupled so that the gap is formed in at least one direction of the x, y, and z axis directions. Due to the dual coupling structure in which the gap is formed in at least one direction of the x, y, and z axis directions, the panel fixing portion 90a is movable together with the guide frame 90b in at least one direction of the x, y, and z axis directions. Hereinafter, the following description will be given of a structure in which gaps are formed between the panel fixing portion 90a and the guide frame 90b in the respective x, y, and z axis directions.

The panel fixing portion 90a is formed in a planar frame form, so that the outer edge portion of the back surface of the liquid crystal panel 100, which is a non-display region of the back surface of the liquid crystal panel 100, can be attached to the front surface of the panel fixing portion 90a by the attachment means 20 such as the adhesive substance and the adhesive tape. In this case, although it is the most outer portion of the LCD device, the liquid crystal panel 100 is fixed by the attachment means 20 without a separate case or cover is further formed to surround a front surface and a side surface of the liquid crystal panel 100.

The panel fixing portion 90a is assembled to the guide frame 90b. The panel fixing portion 90a is assembled to the guide frame 90b in a shape in which gaps are formed in the x, y, and z-axis directions, respectively, so that the panel fixing portion 90a is movable in the x, y, and z axis directions. In other words, the gaps are formed between the panel fixing portion 90a and the guide frame 90b in the x, y, and z-axis directions, respectively, and therefore, the panel fixing portion 90a is movable in the x, y, and z-axis directions even when the guide frame 90b is fixed to another structure of the bottom case 10. Thus, the liquid crystal panel 100 is also attached to the panel fixing portion 90a, is also movable in the x, y, and z-axis directions, since the panel fixing portion 90a is movable in the x, y, and z-axis directions.

The panel fixing portion 90a has a shape opened at its inner surface except for a portion of the front surface thereof on which the liquid crystal panel 100 is to be seated, namely, an outer frame at which the liquid crystal panel 100 is seated. The guide frame 90b is formed in only a square side frame in the form of partially enclosing the side surface or back surface of the seating portion of the panel fixing portion 90a while being formed to be opened at all inner front and back surfaces thereof. Accordingly, the panel guide 90 has a shape in which only the outer seating portion of the front surface at which the liquid crystal panel 100 is seated and the side frame exist, namely, a square frame shape opened at front and back surfaces thereof after being formed by assembling the panel fixing portion 90a and guide frame 90b.

The panel guide 90 is to completely enclose a side surface of the backlight unit 2, namely, the side surface of the bottom case 10 within which a diffusion plate 70, optical sheets 80, etc. are accommodated. In this case, the panel guide 90 is mounted to the side surface of the bottom case 10 by fixing holes formed at the side surfaces of the guide frame 90b.

The panel guide 90 formed in the dual coupling structure of the panel fixing portion 90a and the guide frame 90b may be made of a metal material to improve heat radiating effects, or made of a plastic or mold material to decrease weight. Such a panel guide 90 will be described in more detail with reference to the accompanying drawings later.

The backlight unit 2 includes a plurality of lamps 40, a lamp fixing portion 41, on which the plural lamps 40 are mounted, while being fixedly disposed in the bottom case 10, a diffusion plate 70 to emit light from each lamp 40 in front of the diffusion plate 70, and a plurality of optical sheets 80 disposed over the diffusion plate 70 while vertically emitting the light from the diffusion plate 70 and the light incident surface thereof.

Each of the plural lamps 40 is detachably mounted at the lamp fixing portion 41 to face a side surface of the diffusion plate 70 and a side surface of at least one of the plurality of optical sheets 80, each of the side surfaces being as a light incident surface. Here, Light Emitting Diode (LED) may be used as the lamps 40. Although FIG. 1 illustrates an edge type backlight unit in which the plurality of lamps 40 are located on the sides of the diffusion plate 70 and the optical sheets 80, a direct type backlight unit in which the lamps are located under the diffusion plate 70 and the optical sheets 80 may be used to replace the edge type backlight unit.

The lamps 40 are turned on by a lamp driving power source supplied through the lamp fixing portion 41 to irradiate light to the light incident surfaces of the diffusion plate 70 and each optical sheet 80.

As shown in FIG. 1, the bottom case 10 includes a bottom surface and a side wall which form a receiving space for accommodating and fixing the diffusion plate 70 and the optical sheets 80. The lamp fixing portion 41, on which each of the plurality of lamps 40 is detachably mounted, is fixed to an inner side surface of the side wall. A reflective sheet (not shown) can be disposed on the bottom plate to reflect light from each lamp 40 toward the liquid crystal panel 100. A plurality of protrusion fixing portions 10a corresponding to the fixing holes of the panel guide 90 are formed at an outer side surface of the side wall, and the bottom case 10 is fixed to the inner side surface of the panel guide 90 through the plurality of protrusion fixing portions 10a, in other words, the protrusion fixing portions 10a in the bottom case 10 are assembled to (are engaged with) the fixing holes of the panel guide 90.

The lamp fixing portion 41, which is mounted to the inner side surface of the side wall of the bottom case 10 and to which the plurality of lamps 40 are detachably mounted, supplies the lamp driving power source from the outside to the plurality of lamps 40.

The plurality of optical sheets 80 adjust an optical path of the light which is diffused by the diffusion plate 70 so that the light is vertically irradiated to the liquid crystal panel 100. To this end, the plurality of optical sheets 80 may be comprised of a prism sheet 82, a diffusion sheet 84, and a polarization sheet 86. A protective sheet (not shown) can be placed on the top of the optical sheets 80.

Also, the backlight unit 2 is further provided with a lamp driving circuit unit (not shown), which generates the lamp driving power source from driving each lamp 40. Here, the lamp driving circuit unit is composed of at least one inverter or switching circuits, and generates the lamp driving power source by converting an external power source input as an alternating current power source into a direct current power source. The generated lamp driving power source is supplied to each lamp 40 in a timing suitable for driving the liquid crystal panel 100.

Thus, the plurality of lamps 40 in the backlight unit 2 are turned on by the lamp driving power source supplied from the lamp driving circuit unit, and thus light is irradiated to the liquid crystal panel 100. As described above, the backlight unit 2 is provided with a plurality of optical sheets 80 for vertically irradiating the light, which is diffused by the diffusion plate 70 or the lamps 40, each optical sheet 80. That is, the plurality of optical sheets 80 adjust the optical path of light so that the light is vertically emitted. To this end, the optical sheets 80 have a structure in which a prism sheet 82, a diffusion sheet 84, a polarization sheet 86 are laminated sequentially from bottom to top, and protective sheet (not shown) can be placed on the top of the structure. In this case, the types of laminated sheets or the laminated order may be changed depending on purposes of the backlight unit 2.

Figure 2:
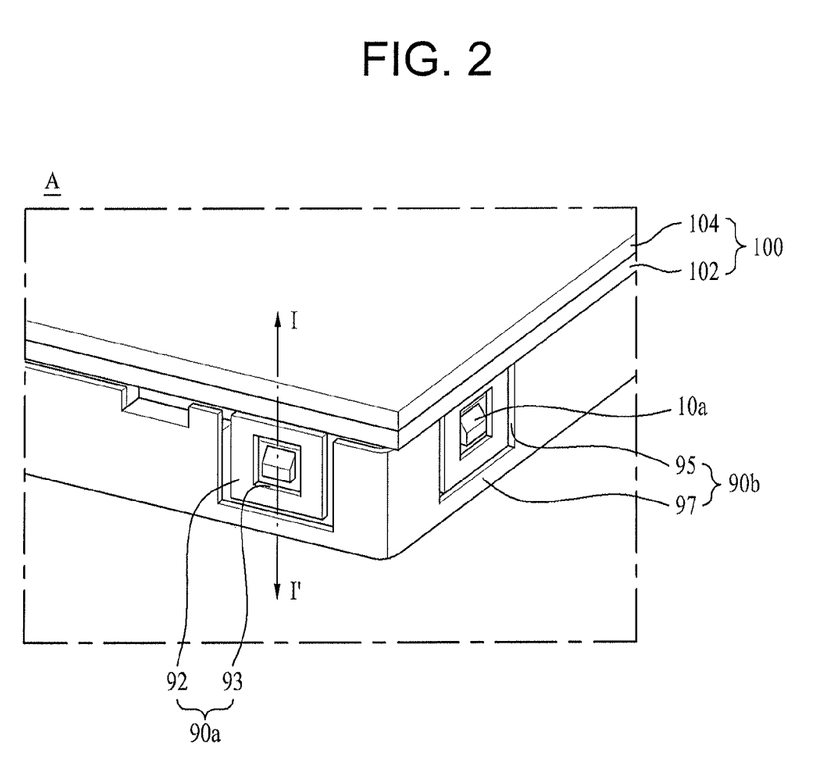
FIG. 2 is a perspective view specifically illustrating portion "A" the flat panel type image display device shown in FIG. 1 when the flat panel type image display device is assembled.
Figure 3:
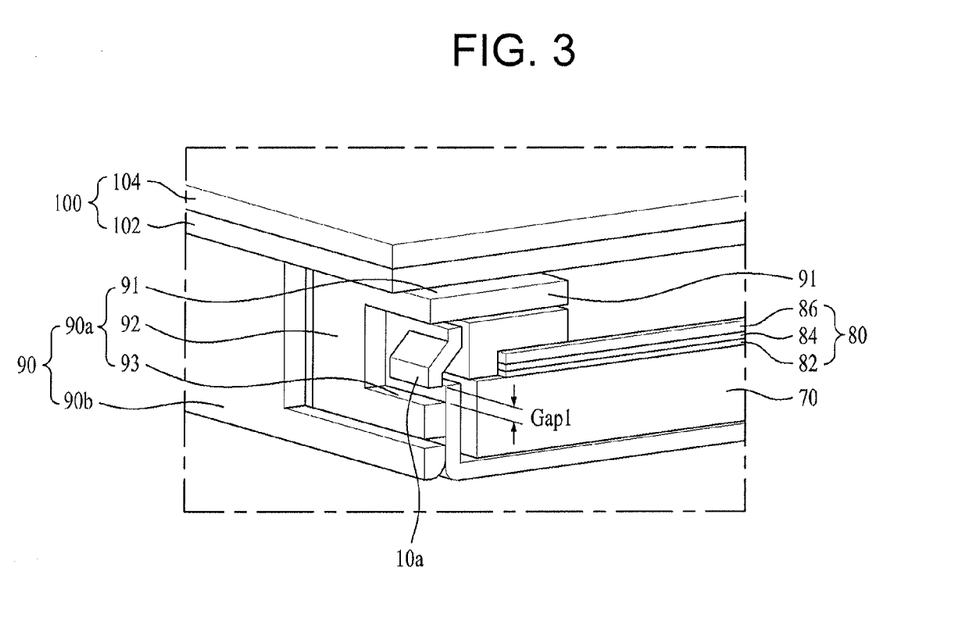
FIG. 3 is a perspective view illustrating a cutting surface taken along line I-I' shown in FIG. 2.
Figure 4:
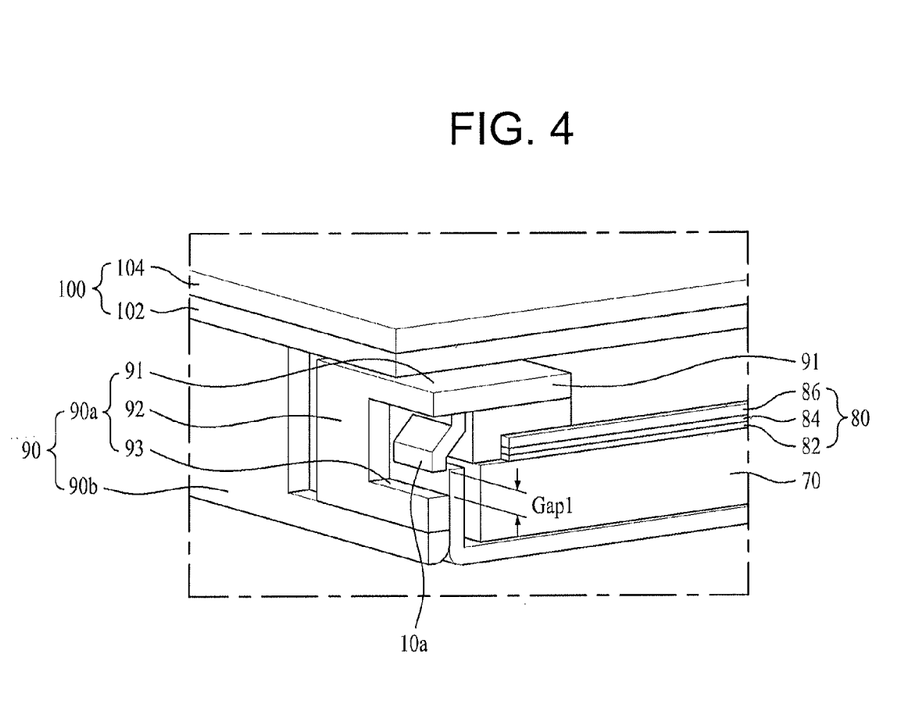
FIG. 4 is a perspective view illustrating a cutting surface taken along line I-I' at which a first gap of FIG. 3 is changed.

FIG. 2 is a perspective view specifically illustrating portion "A" the flat panel type image display device shown in FIG. 1 when the flat panel type image display device is assembled. FIG. 3 is a perspective view illustrating a cutting surface taken along line I-I' shown in FIG. 2. FIG. 4 is a perspective view illustrating a cutting surface taken along line I-I' at which a first gap of FIG. 3 is changed.

Referring to FIGS. 1 and 2, the lamp fixing portion 41 in the backlight unit 2, on which the lamps 40 are detachably mounted, is fixed to an inner side surface of a side wall of the bottom case 10. The diffusion plate 70 and the plurality of optical sheets 80 are sequentially accommodated within the bottom case 10 to face each of the lamps 40, and thus the backlight unit 2 is assembled.

Subsequently, the panel fixing portion 90a and the guide frame 90b are assembled to form the panel guide 90, and the panel guide 90 is mounted to the bottom case 10 so as to cover the outer edge portion of the front surface of the side wall of the bottom case 10 within which the diffusion plate 70 and the optical sheets 80 are accommodated and enclose outer side surface of the side wall of the bottom case 10.

The panel fixing portion 90a of the panel guide 90 includes a panel seating portion 91 having a width corresponding to the outer edge portion of the back surface of the liquid crystal panel 100 to allow the outer edge portion of the back surface of the liquid crystal panel 100 to be attached thereto by a attachment means, a plurality of side assembly portions 92, each of which extending from the panel seating portion 91 and then bending in a direction toward a back surface thereof so as to be respectively fastened to the plural protrusion fixing portions 10a formed at the outer side wall of the bottom case 10, and first fixing holes 93 formed at the plurality of side assembly portions 92 so as to be respectively fastened to the plural protrusion fixing portions 10a of the bottom case 10.

The guide frame 90b to be assembled with the panel fixing portion 90a includes an outer side wall portion 97 to form an outer wall having a square frame shape while having a shape opened at inner front and rear surfaces thereof, and a plurality of opening portions 95 formed corresponding to positions of the respective side assembly portions 92 so as to insert the plural side assembly portions 92 formed at the panel fixing portion 90a, respectively.

The panel fixing portion 90a having such a configuration is assembled in the form of being seated at the front surface of the guide frame 90b. In this case, the side assembly portions 92 of the panel fixing portion 90a are fastened to the protrusion fixing portions 10a of the outer side wall of the bottom case 10 in a state of being inserted into the opening portions 95 of the guide frame 90b, respectively.

In other words, in accordance with the first embodiment of the present invention, the bottom case 10 is formed, at the outer side wall thereof, with a plurality of protrusion fixing portions 10a corresponding to the first fixing holes 93 formed at the side assembly portions 92 of the panel fixing portion 90a, respectively. During assembly of the bottom case 10 and the panel guide 90, the first fixing holes 93 of the side assembly portions 92 inserted into the opening portions 95 of the guide frame 90b are fastened to the protrusion fixing portions 10a, respectively. Accordingly, the guide frame 90b is located between the panel fixing portion 90a and the bottom case 10, so as to restrict a movable distance by the fixed structure of the panel fixing portion 90a and the bottom case 10.

The gaps are formed between the panel fixing portion 90a and guide frame 90b of the panel guide 90, being constituted and assembled as described above, so as to be spaced in the x, y, and z-axis directions, respectively. Consequently, the panel fixing portion 90a is movable in the x, y, and z-axis directions even when the guide frame 90b is fixed to the bottom case 10. That is, the liquid crystal panel 100 is attached to the panel fixing portion 90a, and is movable in the x, y, and z axis directions, together with the panel fixing portion 90a.

Specifically, referring to FIGS. 3 and 4, between each first fixing hole 93 of the panel fixing portion 90a and an associated protrusion fixing portion 10a of the bottom case 10 fitted into the first fixing hole 93, a first gap Gap1 may be formed in a z axis direction. Consequently, the panel fixing portion 90a including the side assembly portion 92 is movable from the fixed panel guide 90 in the z axis direction. The first gap Gap1 is formed between the bottom of the protrusion fixing portion 10a and the inner bottom of the first fixing hole 93 so that the panel fixing portion 90a is movable in the z-axis direction by the first gap Gap1 according to the size and direction of the first gap Gap1.

Figure 5:
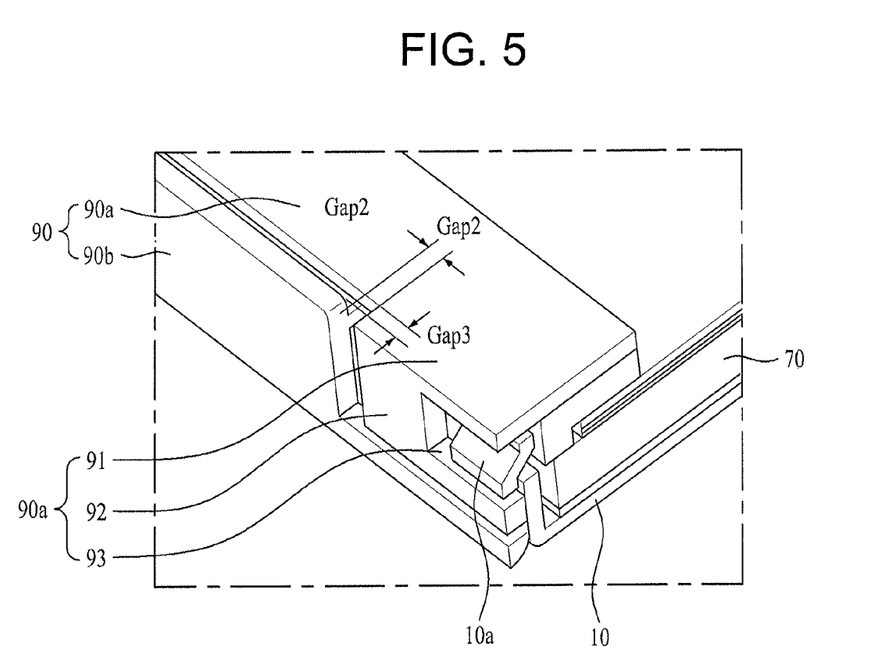
FIG. 5 is a perspective view illustrating a cutting surface taken along line I-I' before attachment of a liquid crystal panel of FIG. 2.
Figure 6:
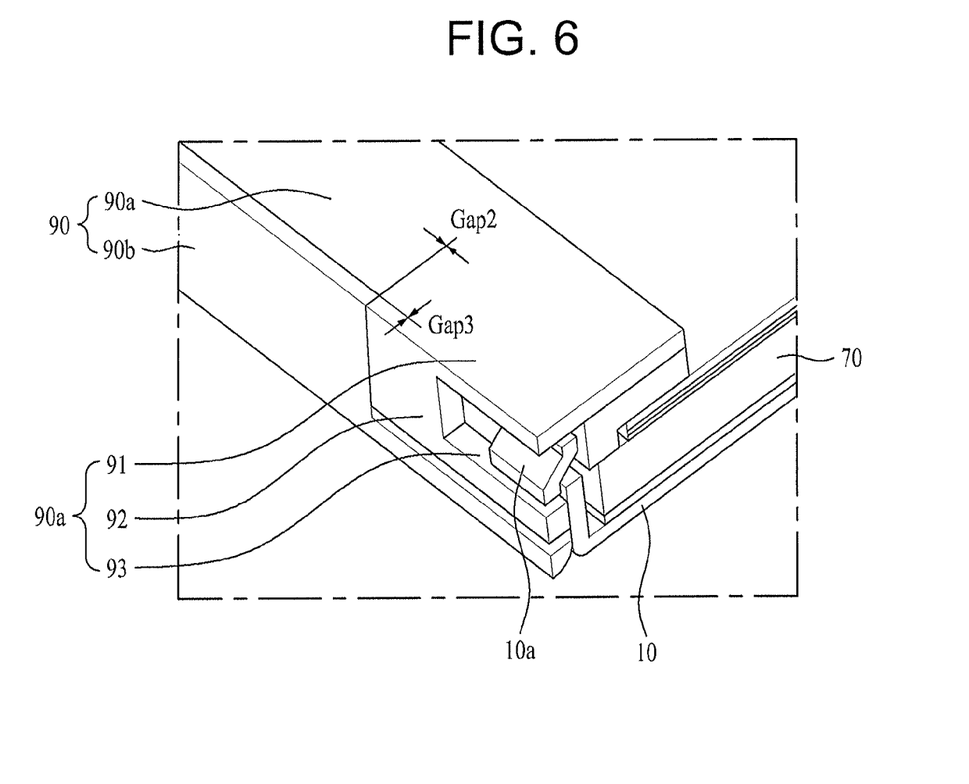
FIG. 6 is a perspective view illustrating a cutting surface taken along line I-I' at which a second gap and a third gap of FIG. 5 are changed.

FIG. 5 is a perspective view illustrating a cutting surface taken along line I-I' before attachment of the liquid crystal panel of FIG. 2, and FIG. 6 is a perspective view illustrating a cutting surface taken along line I-I' at which a second gap and a third gap of FIG. 5 are changed.

Referring to FIGS. 5 and 6, between the outer side wall of the guide frame 90b and each side assembly portion 92 of the panel fixing portion 90a, which are assembled to each other, a second gap Gap2 is formed in an x axis direction so that the panel fixing portion 90a including the side assembly portion 92 is movable from the fixed guide frame 90b in the x axis direction by the second gap Gap2. That is, the outer side wall of the guide frame 90b and each side assembly portion 92 of the panel fixing portion 90a may be in contact with each other as shown in FIG. 6 or may be spaced from each other by the second gap Gap2 as shown in FIG. 5.

Furthermore, between the entire outer side wall of the guide frame 90b and the panel seating portion 91 of the panel fixing portion 90a, which are assembled to each other, a third gap Gap3 is formed in a y axis direction so that the panel fixing portion 90a including the panel seating portion 91 is movable from the fixed panel guide 90 in the y axis direction by the third gap Gap3. That is, the entire outer side wall of the guide frame 90b and the panel seating portion 91 of the panel fixing portion 90a may be in contact with each other as shown in FIG. 6 or may be spaced from each other by the second gap Gap2 as shown in FIG. 5.

Figure 7:
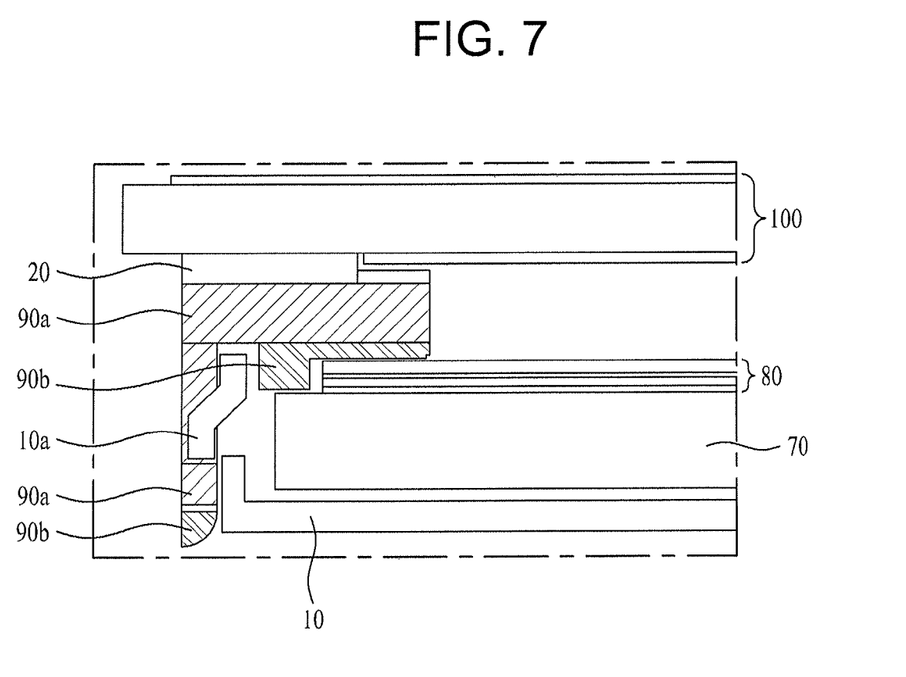
FIG. 7 is a sectional view illustrating the cutting surface taken along line I-I' shown in FIG. 2.

FIG. 7 is a sectional view illustrating the cutting surface taken along line I-I' shown in FIG. 2.

The following description will be given of an assembly process of the flat panel type LCD device according to the illustrated embodiment of the present invention with reference to FIGS. 1 and 7.

First, the lamp fixing portion 41 on which the plurality of lamps are amounted is fixed to one inner side surface of the bottom case 10. The diffusion plate 70 and the plural optical sheets 80 are sequentially accommodated within the bottom case 10 to face each of the lamps 40, and thus the backlight unit 2 is assembled.

Subsequently, the panel guide 90 is formed by assembling the panel fixing portion 90a and the guide frame 90b, and is mounted to the bottom case 10 so as to cover the outer side surface and the front surface of the side wall of the bottom case 10 within which the diffusion plate 70 and the optical sheets 80 are accommodated and enclose the side surface of the bottom case 10. In this case, the first fixing holes 93 of the panel fixing portion 90a are fastened to the protrusion fixing portions 10a of the bottom case 10, respectively, and thus the guide frame 90b including the panel fixing portion 90a and the bottom case 10 are assembled together.

In addition, when the panel guide 90 is mounted to the bottom case 10, the liquid crystal panel 100 is fixed to the panel seating portion 91 of the panel guide 90, namely, to the panel seating portion 91 of the panel fixing portion 90a by the separate attachment.

The gaps are formed between the panel fixing portion 90a and guide frame 90b of the panel guide 90, and the protrusion fixing portions 10a of the bottom case 10, being constituted and assembled as described above, so as to be spaced in the x, y, and z axis directions, respectively. Consequently, the panel fixing portion 90a is movable in the x, y, and z-axis directions even when the guide frame 90b is fixed to the bottom case 10. That is, the liquid crystal panel 100 is attached to the panel fixing portion 90a, and is movable in the x, y, and z-axis directions, together with the panel fixing portion 90a. Thus, the flat panel type image display device and the method for manufacturing the same according to exemplary embodiments of the present invention may allow the image display panel of the flat panel type image display device formed in a clear borderless design to be fixed to the dual coupling structure, thereby preventing the image display panel and the dual coupling structure from being deformed by external pressure or impact. Also, it may be possible to facilitate assembly and disassembly of the flat panel type image display device, thereby achieving enhancement in entire process yield.

Figure 8:
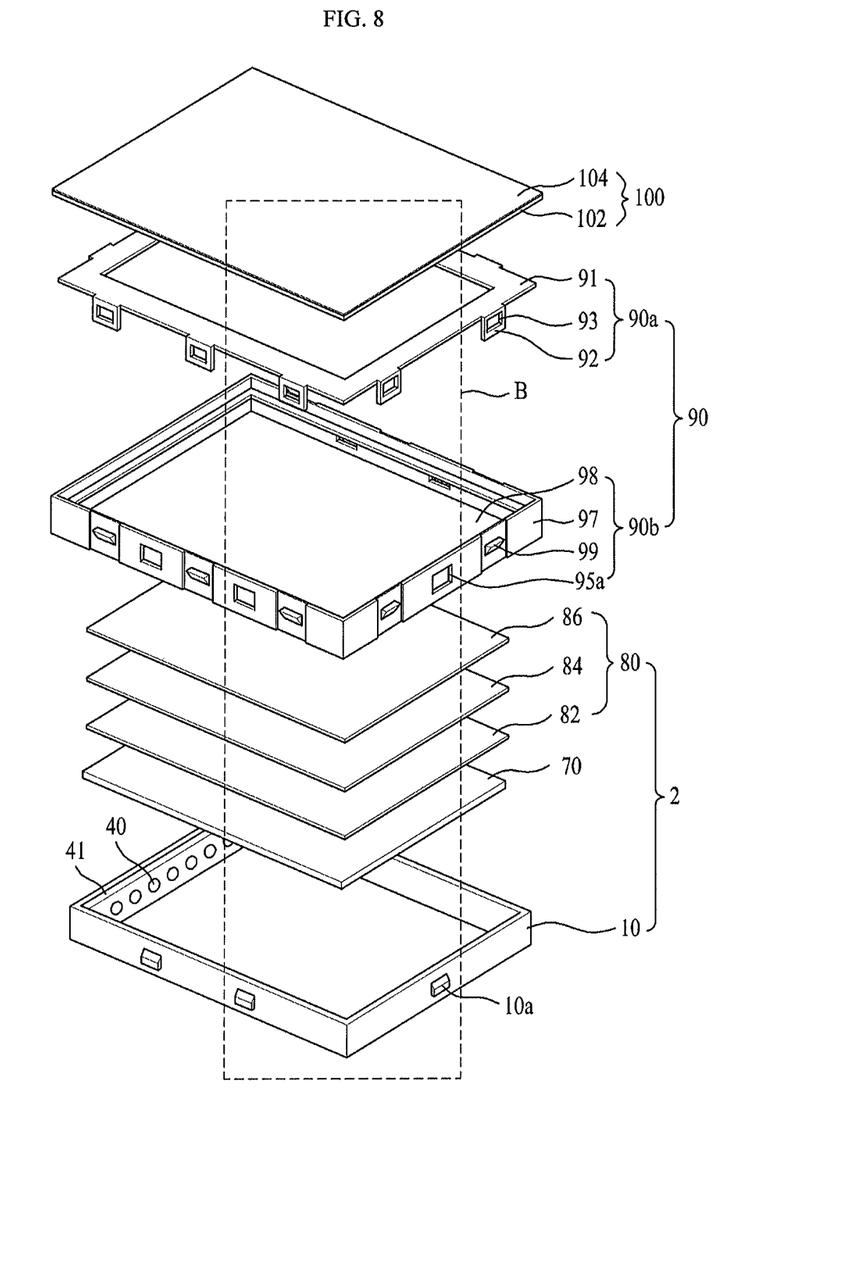
FIG. 8 is an exploded perspective view schematically illustrating a flat panel type image display device according to another embodiment of the present invention.
Figure 9:
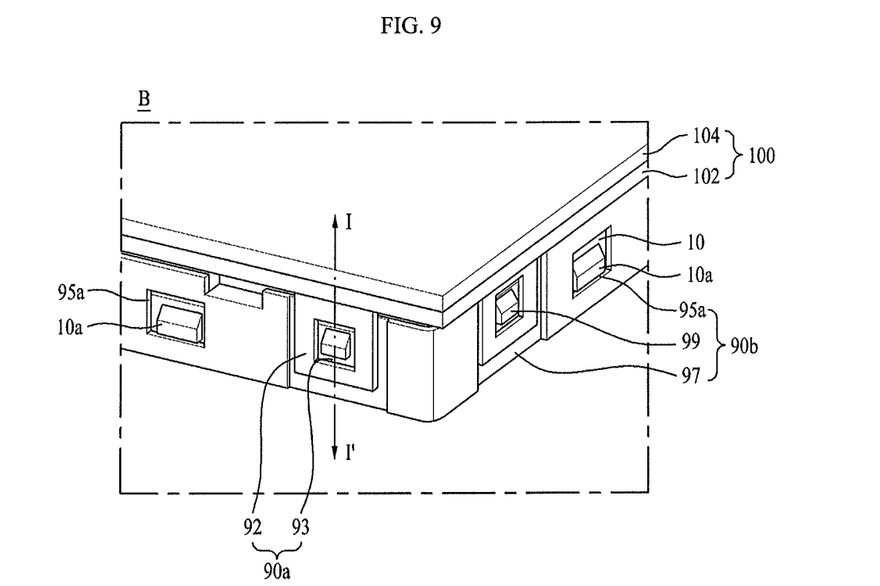
FIG. 9 is a perspective view specifically illustrating portion "B" of a form in which the flat panel type image display device shown in FIG. 8 is assembled.

FIG. 8 is an exploded perspective view schematically illustrating a flat panel type image display device according to a second embodiment of the present invention. FIG. 9 is a perspective view specifically illustrating portion "B" of a form in which the flat panel type image display device shown in FIG. 8 is assembled.

The flat panel type image display device shown in FIG. 8 has the same structure as the flat panel type image display device shown in FIG. 1, in the attachment structure of the liquid crystal panel 100 and the assembly structure of the backlight unit 2. However, the flat panel type image display device according to the present embodiment differs from that in FIG. 1 in the case of the assembly structure of a panel guide 90, which includes a panel fixing portion 90a to which the liquid crystal panel 100 is attached and a guide frame 90b assembled with the panel fixing portion 90a, and the assembly structure of the panel guide 90 and a bottom case 10.

Referring to FIGS. 8 and 9, the panel fixing portion 90a of the panel guide 90 includes a panel seating portion 91 formed, at a surface thereof corresponding to the outer edge portion of a back surface of the liquid crystal panel 100, as a plane surface so as to allow the outer edge portion of the back surface of the liquid crystal panel 100 to be attached, a plurality of side assembly portions 92, each of which extending from the panel seating portion 91 and being bent in a direction toward a back surface thereof so as to be fastened to the guide frame 90b, and first fixing holes 93 formed as a shape opened at the plural side assembly portions 92 so as to be fastened to the guide frame 90*b*, respectively.

The guide frame 90*b* assembled with the panel fixing portion 90*a* includes an outer side wall portion 97 to form an outer wall having a square frame shape while having a shape opened at inner front and rear surfaces thereof, a plurality of fixing protrusion portions 99 protruding from the outer side wall portion 97 so as to be fastened to the first fixing holes 93 formed at the side assembly portions 92 of the panel fixing portion 90*a*, respectively, and a plurality of fastening holes 95*a* formed corresponding to a plurality of protrusion fixing portions 10*a* protruding from the outer side wall of the bottom case 10 so as to be fastened to the protrusion fixing portions 10*a* during assembly thereof, respectively. The panel fixing portion 90*a* constituted as described above is assembled to be seated at a front surface of the guide frame 90*b*. In this case, the side assembly portions 92 of the panel fixing portion 90*a* are assembled to be inserted into opening portions 95 of the guide frame 90*b*, respectively.

The panel fixing portion 90*a* according to the second embodiment of the present invention is assembled to be seated at the front surface of the guide frame 90*b*. In this case, the side assembly portions 92 of the panel fixing portion 90*a* are fastened to the fixing protrusion portions 99 formed at the outer side wall of the guide frame 90*b*, respectively.

The guide frame 90*b* is assembled in the form of being seated at the front surface of the bottom case 10 so as to wholly enclose the front and side surfaces of the bottom case 10. In this case, the plural fastening holes 95*a* formed at the outer side wall of the guide frame 90*b* are fastened to the protrusion fixing portions 10*a* protruding from the outer side wall of the bottom case 10, respectively.

The gaps are formed between the panel fixing portion 90*a* and guide frame 90*b* of the panel guide 90, and the protrusion fixing portions 10*a* of the bottom case 10, being constituted and assembled as described above, so as to be spaced in x, y, and z axis directions, respectively. Consequently, the panel fixing portion 90*a* is movable in the x, y, and z-axis directions even when the guide frame 90*b* is fixed to the bottom case 10. That is, the liquid crystal panel 100 is attached to the panel fixing portion 90*a*, and is movable in the x, y, and z-axis directions, together with the panel fixing portion 90*a*.

Specifically, between the first fixing hole 93 of each side assembly portion 92 and the associated fixing protrusion portion 99 of the guide frame 90*b*, and between each fastening hole 95 of the guide frame 90*b* and the associated protrusion fixing portion 10*a* of the bottom case 10, first gaps Gap1 are respectively formed in a z axis direction, which is a front direction, so that the panel fixing portion 90*a* including the side assembly portion 92 is movable from the fixed bottom case 10 in the z axis direction by the first gap Gap1.

Also, between the outer side wall portion 97 of the guide frame 90*b* and each side assembly portion 92 of the panel fixing portion 90*a*, and between the outer side wall portion of the bottom case 10 and the inner surface 98 portion of the guide frame 90*b*, which are assembled to each other, second gaps Gap2 are respectively formed in an x axis direction so that the panel fixing portion 90*a* including the side assembly portion 92 is movable from the outer side wall portion of the bottom case 10 in the x axis direction by the second gap Gap2.

Furthermore, between the outer side wall portion 97 of the guide frame 90*b* and the panel seating portion 91 of the panel fixing portion 90*a*, which are assembled to each other, a third gap Gap3 is formed in a y axis direction so that the panel fixing portion 90*a* including the panel seating portion 91 is movable from the fixed panel guide 90 in the y axis direction by the third gap Gap3.

Figure 10:
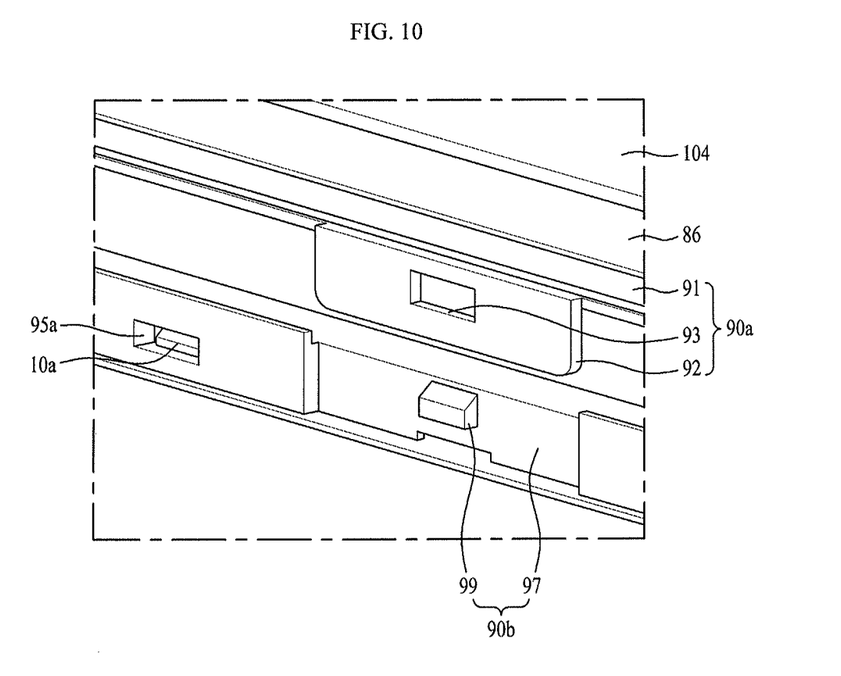
FIG. 10 is an exploded perspective view partially illustrating portion "B" before attachment of a liquid crystal panel.
Figure 11:
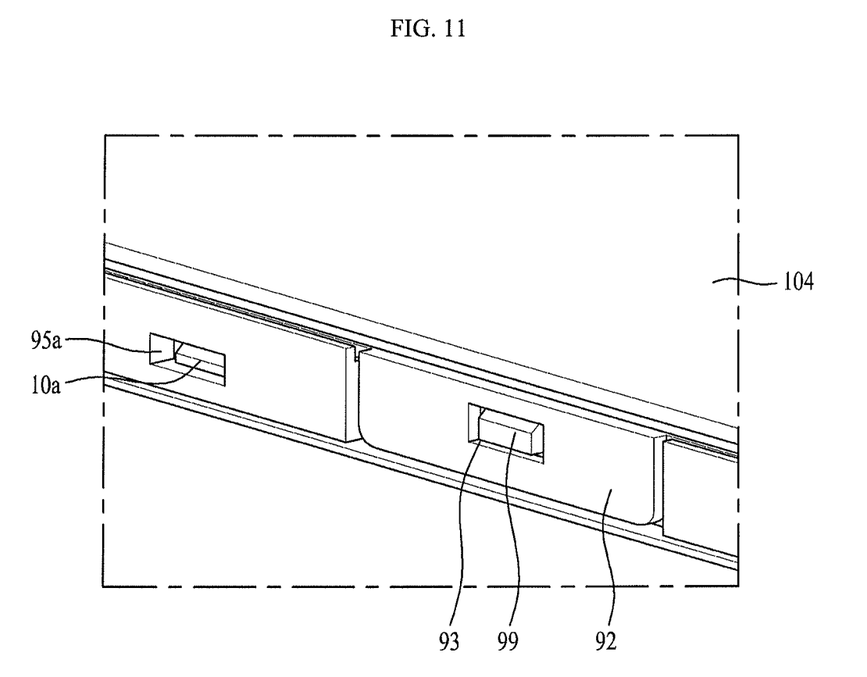
FIG. 11 is a perspective view partially illustrating portion "B" in a state in which a panel guide and a bottom case are assembled.

FIG. 10 is an exploded perspective view partially illustrating portion "B" before attachment of the liquid crystal panel, and FIG. 11 is a perspective view partially illustrating portion "B" in a state in which a panel guide and a bottom case are assembled.

Referring to FIGS. 10 and 11, the following description will be given of the assembly process of the flat panel type image display device according to the present invention.

First, a lamp fixing portion 41, on which a plurality of lamps 40 is mounted, is disposed to be fixed to an side surface an inner portion of the bottom case 10, and a diffusion plate 70 and a plurality of optical sheets 80 are successively accommodated to the inner portion of the bottom case facing each lamp 40, thereby assembling the backlight unit 2.

Subsequently, the guide frame 90*b* is assembled in the form of being seated at the front surface of the bottom case 10 so as to wholly enclose the front and side surfaces of the bottom case 10. In this case, the plural fastening holes 95*a* formed at the outer side wall of the guide frame 90*b* are fastened to the protrusion fixing portions 10*a* protruding from the outer side wall of the bottom case 10, respectively. The panel fixing portion 90*a* is assembled to be seated at the front surface of the guide frame 90*b*. In this case, the side assembly portions 92 of the panel fixing portion 90*a*, namely, the first fixing holes 93 of the respective side assembly portions 92 are fastened and assembled to the fixing protrusion portions 99 formed at the outer side wall of the guide frame 90*b*, respectively.

When the panel guide 90 is mounted at the bottom case 10, the liquid crystal panel 100 is attached and fixed to the panel seating portion 91 of the panel guide 90, namely, the panel seating portion 91 of the panel fixing portion 90*a* by a separate adhesive means.

The gap is formed between the panel fixing portion 90*a* and guide frame 90*b* of the panel guide 90, and the protrusion fixing portion 10*a* of the bottom case 10, being constituted and assembled as described above, so as to be spaced in at least one direction of the x, y, and z axis directions, and thus the panel fixing portion 90*a* is movable. That is, the liquid crystal panel 100 is attached to the panel fixing portion 90*a*, and is movable in any one direction of the x, y, and z-axis directions, together with the panel fixing portion 90*a*. Thus, the flat panel type image display device and the method for manufacturing the same according to exemplary embodiments of the present invention may allow the image display panel of the flat panel type image display device formed in a clear borderless design to be fixed to the dual coupling structure, thereby preventing the image display panel and the dual coupling structure from being deformed by external pressure or impact. Also, it may be possible to facilitate assembly and disassembly of the flat panel type image display device, thereby achieving enhancement in entire process yield.

As is apparent from the above description, a flat panel type image display device and a method for manufacturing the same according to exemplary embodiments of the present invention may allow an image display panel of the flat panel type image display device formed in a clear borderless design to be fixed to a dual coupling structure, thereby preventing the image display panel and the dual coupling structure from being deformed by external pressure or impact. Also, it may be possible to facilitate assembly and disassembly of the flat panel type image display device, thereby achieving enhancement in entire process yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. A flat panel type image display device comprising:
an image display panel to display an image;
a panel guide comprising a panel fixing portion, to which the image display panel is attached, and a guide frame comprises a plurality of dual coupling structures on surrounding sidewalls, the panel fixing portion being configured to move together with the guide frame in at least one direction of x, y, and z-axis directions;
a bottom case formed to cover an opened back surface of the panel guide,
wherein the plurality of dual coupling structures comprise a plurality of fixing protrusions protruding out from the surrounding sidewalls, and a plurality of fixing through holes on the surrounding sidewalls of the guide frame,
wherein the guide frame couples to the panel fixing portion on its top side and couples to the bottom case on its bottom side utilizing the plurality of dual coupling structures to couple to one or both of corresponding fixing protrusions and corresponding fixing through holes on the panel fixing portion and the bottom case;
a backlight unit housed in the bottom case, the backlight unit comprising a plurality of light sources disposed along an inner sidewall of the bottom case, a diffusion plate and optical sheets on the bottom case.

2. The flat panel type image display device according to claim 1,
wherein the guide frame is assembled with the panel fixing portion to which the image display panel is attached and formed with a gap in at least one direction of the x, y, and z-axis directions so that the panel fixing portion is movable in at least one direction of the x, y, and z-axis directions.

3. The flat panel type image display device according to claim 2, wherein the panel fixing portion further comprises:
a plurality of side assembly portions, each of which extending from the panel seating portion and being bent in a direction toward a back surface thereof, thereby being fastened to a plurality of protrusion fixing portions formed at an outer side wall of the bottom case, respectively; and
a plurality of first fixing holes formed as a shape opened at the side assembly portions so as to be fastened to the protrusion fixing portions of the bottom case, respectively, and
wherein the guide frame comprises:
an outer side wall portion to form an outer wall having a square frame shape while having a shape opened at inner front and rear surfaces thereof; and
a plurality of opening portions formed corresponding to positions of the respective side assembly portions so as to insert the plural side assembly portions formed at the panel fixing portion, respectively.

4. The flat panel type image display device according to claim 3,
wherein between the first fixing hole of each side assembly portion and the protrusion fixing portion of the bottom case fitted into the first fixing hole, a first gap is formed in a z axis direction, which is a front direction, so that the panel fixing portion comprising the side assembly portion is movable from the panel guide in the z axis direction by the first gap,
wherein between the outer side wall portion of the guide frame and each side assembly portion of the panel fixing portion, a second gap is formed in an x-axis direction, which is a vertical direction, so that the panel fixing portion comprising the side assembly portion is movable from the panel guide in the x axis direction by the second gap, and
wherein between the outer side wall portion of the guide frame and the panel seating portion of the panel fixing portion, which are assembled to each other, a third gap is formed in a y-axis direction, which is a left and right direction, so that the panel fixing portion comprising the panel seating portion is movable from the panel guide in the y axis direction by the third gap.

5. The flat panel type image display device according to claim 2, wherein the panel fixing portion of the panel guide comprises:
a panel seating portion formed, at a surface thereof corresponding to the outer edge portion of the back surface of the image display panel, as a plane surface so as to allow the outer edge portion of the back surface of the image display panel to be attached;
a plurality of side assembly portions, each of which extending from the panel seating portion and being bent in a direction toward a back surface thereof, thereby being fastened to the guide frame; and
a plurality of first fixing holes formed as a shape opened at the respective side assembly portions so as to be fastened to the guide frame, and
wherein the guide frame comprises:
an outer side wall portion to form an outer wall having a square frame shape while having a shape opened at inner front and rear surfaces thereof;
a plurality of fixing protrusion portions protruding from the outer side wall portion so as to be fastened to the first fixing holes formed at the side assembly portions of the panel fixing portion, respectively; and
a plurality of fastening holes formed corresponding to a plurality of protrusion fixing portions protruding from an outer side wall so as to be fastened to the protrusion fixing portions, respectively.

6. The flat panel type image display device according to claim 5,
wherein between the first fixing hole of each side assembly portion and each fixing protrusion portion of the guide frame, and between each fastening hole of the guide frame and each protrusion fixing portion of the bottom case, first gaps are respectively formed in a z-axis direction, which is a front direction, so that the panel fixing portion comprising the side assembly portion is movable from the fixed bottom case in the z axis direction by the first gap,
wherein between the outer side wall portion of the guide frame and each side assembly portion of the panel fixing portion, and between the outer side wall portion of the bottom case and an inner surface portion of the guide frame, second gaps are respectively formed in an x axis direction, which is a vertical direction, so that the panel fixing portion comprising the side assembly portion is movable from the outer side wall portion of the bottom case in the x-axis direction by the second gap, and
wherein between the outer side wall portion of the guide frame and the panel seating portion of the panel fixing portion, a third gap is formed in a y-axis direction, which is a left and right direction, so that the panel fixing portion comprising the panel seating portion is movable from the fixed panel guide in the y-axis direction by the third gap.

7. A method for manufacturing a flat panel type image display device comprising:
- assembling a backlight unit comprising a plurality of light sources disposed along an inner sidewall of a bottom case, a diffusion plate and optical sheets on the bottom case;
- assembling a panel guide in a plurality of dual coupling structures on surrounding sidewalls wherein a panel fixing portion and a guide frame is coupled so that the panel fixing portion and the guide frame are movable in at least one axis direction of x, y, and z-axis directions;
- assembling the bottom case formed to cover an opened back surface of the panel guide to the panel guide,
  - wherein the plurality of dual coupling structures comprise a plurality of fixing protrusions protruding out from the surrounding sidewalls, and a plurality of fixing through holes on the surrounding sidewalls of the guide frame,
  - wherein the guide frame couples to the panel fixing portion on its top side and couples to the bottom case on its bottom side utilizing the plurality of dual coupling structures to couple to one or both of corresponding fixing protrusions and corresponding fixing through holes on the panel fixing portion and the bottom case; and
- attaching an image display panel to display an image to a front surface of the panel guide,
  - wherein the panel fixing portion comprises a panel seating portion having a surface corresponding to the outer edge portion of a back surface of the image display panel, the surface of the panel seating portion being a flat surface, to which the outer edge portion of the back surface of the image display panel is attached,
  - wherein the image display panel is disposed on the panel seating portion and an edge of the image display panel is exposed.

8. The method for manufacturing the flat panel type image display device according to claim 7, wherein the assembling the panel guide comprises:
- preparing the panel fixing portion and a guide frame formed with a gap in at least one direction of the x, y, and z axis directions so that the panel fixing portion is movable in at least one direction of the x, y, and z axis directions; and
- assembling the guide frame, the panel fixing portion, and the bottom case.

9. The method for manufacturing the flat panel type image display device according to claim 8, wherein the assembling the panel guide comprises:
- assembling the panel fixing portion in the form of being seated at a front surface of the guide frame so that side assembly portions of the panel fixing portion are fastened to protrusion fixing portions formed at an outer side wall of the bottom case in a state of being inserted into opening portions of the guide frame, respectively,
- wherein the guide frame is located between the panel fixing portion and the bottom case, so as to restrict a movable distance by a fixed structure of the panel fixing portion and the bottom case.

10. The method for manufacturing the flat panel type image display device according to claim 8, wherein the assembling the panel guide comprises:
- assembling the guide frame in the form of being seated at a front surface of the bottom case so as to wholly enclose the front and side surfaces of the bottom case so that a plurality of fastening holes formed at an outer side wall of the guide frame is fastened to protrusion fixing portions protruding from an outer side wall of the bottom case, respectively; and
- assembling the panel fixing portion in the form of being seated at a front surface of the guide frame so that side assembly portions formed at the panel fixing portion is fastened and assembled to fixing protrusion portions formed at the outer side wall of the guide frame, respectively.

* * * * *